United States Patent
Falk et al.

(10) Patent No.: US 6,841,332 B2
(45) Date of Patent: Jan. 11, 2005

(54) PHOTORESIST COMPOUND AND METHOD FOR STRUCTURING A PHOTORESIST LAYER

(75) Inventors: Gertrud Falk, Erlangen (DE); Eberhard Kuehn, Hemhofen (DE); Ernst Christian Richter, Erlangen-Bruck (DE); Michael Sebald, Weisendorf (DE)

(73) Assignee: Infineon Technology AG, Munich (DE)

( * ) Notice: Subject to any disclaimer, the term of this patent is extended or adjusted under 35 U.S.C. 154(b) by 222 days.

(21) Appl. No.: 10/133,620

(22) Filed: Apr. 26, 2002

(65) Prior Publication Data

US 2003/0022111 A1 Jan. 30, 2003

(30) Foreign Application Priority Data

Apr. 27, 2001 (DE) .......................... 101 20 661

(51) Int. Cl.[7] .............................................. G03F 7/039
(52) U.S. Cl. ................................ 430/270.1; 430/281.1; 430/284.1; 430/285.1; 430/286.1; 430/322; 430/330
(58) Field of Search ........................... 430/270.1, 281.1, 430/284.1, 286.1, 322, 327, 330

(56) References Cited

U.S. PATENT DOCUMENTS

| | | | |
|---|---|---|---|
| 5,234,793 A | 8/1993 | Sebald et al. ................ 430/323 |
| 5,650,261 A | 7/1997 | Winkle ..................... 430/270.1 |
| 5,783,354 A | 7/1998 | Schwalm et al. ........... 430/170 |
| 5,932,391 A | 8/1999 | Ushirogouchi et al. ... 430/270.1 |
| 6,114,086 A | 9/2000 | Kobayashi et al. ....... 430/270.1 |
| 2002/0160318 A1 * | 10/2002 | Richter et al. .............. 430/324 |
| 2003/0087182 A1 * | 5/2003 | Rottstegge et al. ...... 430/270.1 |
| 2003/0096194 A1 * | 5/2003 | Rottstegge et al. ......... 430/311 |

FOREIGN PATENT DOCUMENTS

| | | | |
|---|---|---|---|
| DE | 195 33 608 | 3/1997 | |
| EP | 0 395 917 | 6/1997 | |
| EP | 860 740 A1 * | 8/1998 | ........... G03F/7/004 |
| EP | 1 041 445 | 10/2000 | |
| EP | 1 154 321 | 11/2001 | |

OTHER PUBLICATIONS

Hiroshi, "Deep–UV Resists: Evolution and Status", *Solid State Technology*, Jul. 1996, pp. 164–166, 168, 170, 173.

* cited by examiner

Primary Examiner—Barbara L. Gilliam
(74) Attorney, Agent, or Firm—Schiff Hardin LLP

(57) ABSTRACT

A photoresist compound or composition achieves a uniform volume growth in a chemical expansion on a chemically expandable photomask during a method for structuring a layer of the photoresist compound. The photoresist composition comprises a film-forming polymer having molecular groups that can be converted into alkali-soluble groups through acid-catalyzed separation reactions, and reactive molecular groups that can react with an expansion component so as to form a chemical bond. In addition, the photoresist composition comprises a photoacid generator that releases an acid upon exposure with radiation from a suitable wavelength range, and a thermoacid generator that releases an acid when supplied with sufficient thermal energy.

21 Claims, No Drawings

PHOTORESIST COMPOUND AND METHOD FOR STRUCTURING A PHOTORESIST LAYER

BACKGROUND OF THE INVENTION

The invention relates to a photoresist compound or composition, as well as a method for structuring a photoresist layer.

In semiconductor technology, photolithographic methods for producing integrated circuits on a semiconductor substrate play a central role. In these methods, photoresist layers are typically applied onto the surface of a substrate that is to be structured, and are subsequently structurally exposed with radiation from a suitable wavelength range. Here, the structural exposure takes place using a lithography mask, through which the structure that is to be transferred into the substrate is predetermined. The exposed regions of the photoresist layer are chemically modified by the exposure, thus modifying their polarity. In this way, the exposed and unexposed regions of the photoresist have different solubility's in relation to a corresponding developer. This fact is exploited in the subsequent developing step for the selective removal of the exposed or unexposed regions. The regions of the photoresist layer remaining on the substrate are used in the following structuring step as a mask, which protects the substrate layer located underneath it from a wearing away of material or modification of the material. Such a structuring step can be for example a plasma etching, a wet-chemical etching, or an ion implantation.

The photoresists used for the structuring of semiconductor components must meet a multiplicity of demands. On the one hand, they must enable the transfer of structures that are increasingly becoming smaller into the layer to be structured. On the other hand, the photoresist layers must ensure a sufficient edge coverage of the structures already produced on the substrate in preceding process steps. While the precise transfer of structures that are as small as possible generally requires the use of photoresist layers that are as thin as possible, a sufficient edge coverage is generally achieved using relatively thick photoresist layers. In order to meet these opposed requirements, two-layer techniques, or multilayer techniques, are often used. For example, a two-layer photoresist is used in which, on a lower, relatively thick, planarizing photoresist layer (bottom resist), a second, relatively thin photoresist layer (top resist) is applied. The structure produced according to conventional methods in the top resist is subsequently transferred into the bottom resist in an anisotropic etching method, e.g. using an oxygen/RIE plasma method, the developed top resist structure being used as a mask. Through this two-layer technique, the dimensions of the structures that can be imaged can be significantly reduced, i.e., the resolution can be significantly improved.

Chemically strengthened resists (chemical amplification resists; CAR) have proven particularly effective as photoresists both for one-layer resists, which can be wet-developed, and for two-layer resist systems, which can be partly or entirely dry-developed. In these photoresists, photoacid generators can be used as photosensitive compounds. An overview of the subject is given by H. Ito in *Solid State Technology*, July 1996, p. 164 ff. In a selected group of these systems, the solubility modification is achieved using the principle of acid-catalyzed separation or decomposition. This principle can be used both in resists that operate positively and those that operate negatively. In the case of a positive resist, in a heating step a polar molecular group, for example a carboxylic acid, is formed from an unpolar chemical group, for example a carboxylic acid tert.-butyl ester group, in the presence of a photolytically produced acid. Further examples of unpolar "blocked" groups that can be converted into corresponding polar groups through acid-catalyzed reactions include the tert.-butoxycarbonyloxy (t-BOC) or acetal groups. Through the conversion of the unpolar groups into the corresponding polar groups, the resist undergoes a change of polarity in the previously irradiated regions, and thus becomes soluble in relation to a polar, aqueous-alkaline or diluted alkaline developer. In this way, the exposed regions of the photoresist can be removed selectively by the developer.

The resolution, i.e., the smallest imageable structure (critical dimension: CD) that can be achieved in the photolithographic production of resist structures, is determined by the photolithographic properties of the photoresist material, the wavelength of the radiation used for the exposure, and the numerical aperture of the imaging optics. This dependence essentially allows an improvement of the resolution to be made only by enlarging the numerical aperture or by reducing the wavelength of the radiation used for the exposure. However, the use of particularly shortwave radiation requires the development of special photoresists that combine suitable absorption properties with the other required properties, such as for example etching resistance and sufficient ability to be developed. Due to this, the number of suitable photoresists is sharply limited.

A completely different approach, through which an improved resolution can be achieved independent of the wavelength of the radiation used for the exposure, is what is known as the two-layer CARL method, as described for example in U.S. Pat. No. 5,234,793 whose disclosure is incorporated by reference thereto and which claims priority from the same German application as European patent EP 395 917. In this method, the developed top resist structure of a two-layer photoresist is modified through an additional chemical expansion step before the etching of the bottom resist. Here, the developed top resist structure is exposed to an expansion agent containing an expansion or bulging component. The expansion component forms a chemical linkage with the functional groups of the photoresist, resulting in a volume-increasing building of the expansion component into the top resist. This building in achieves a defined broadening of the top resist structure through lateral layer thickness growth, as well as a defined increase in height through vertical layer thickness growth. Here the lateral and vertical layer thickness growths can differ markedly.

However, a problem in this method consists in the achieving of a constant layer thickness growth within all regions of the top resist structure. Frequently, the vertical layer thickness growth on the surface regions of the photoresist structure is uniform, whereas, in contrast, a non-uniform lateral layer thickness growth can be observed on the edge regions of the photoresist structure.

This problem is connected with the absorption of radiation by the photoresist material during the structural exposure. In the chemical expansion of chemically reinforced photoresists, the layer thickness growth rate increases as the radiation dosage of the structural exposure increases. This can be explained in that, as the exposure dosages increase, there is an increased production of polar groups in the photoresist by the photoacid generator, and these polar groups influence the layer thickness growth rate. Because most of the functional groups that can react with the expansion component are likewise polar hydrophilic groups, as a rule the growth process is based on an equilibrium between the capacity of the exposed photoresist to be developed and its capacity to be expanded. This equilibrium can be influenced in directed fashion by the polar character of the base polymer in the photoresist. The expansion agent can thus likewise be used as a developer.

During the structuring exposure and the subsequent development of a photoresist film, defined resist profiles are produced. According to the orientation of the surface of the individual regions of the resist profile, it is possible to distinguish between the profile upper edges, whose surface runs essentially parallel to the surface situated under the photoresist, and the profile edges, whose surface runs essentially perpendicular to the surface situated under the photoresist. The exposure dosage within the top resist film decreases continuously as the layer thickness increases, due to the intensity losses caused by radiation absorption. As a consequence, in chemically reinforced photoresists the number of polar hydrophilic groups that are released by the photolytically produced acid decreases in the same manner within the layer. This has the consequence that, as the depth increases, the profile edges have a changed polarity, and thus a changed hydrophilic character. This polarity gradient within the profile edge regions results in a modified lateral layer thickness growth as the profile depth increases. This has a decisive influence on the lateral wall profile produced with the expansion step. A uniform layer thickness growth on the profile edges is of decisive importance for the quality of the photoresist mask, and thus for the resolution of a structuring step, such as for example a substrate etching. Masks having almost perpendicular or vertical profile edges, which enable a structuring of the top resist that is as anisotropic as possible, are preferred for subsequent process steps. This requirement is of particular importance due to the increasing scale of semiconductor components.

SUMMARY OF THE INVENTION

The present invention is therefore based on the object of providing an improved photoresist composition or compound, through which the above-described disadvantages are reduced or are avoided entirely. In particular, the object of the present invention is to provide a photoresist compound or composition that can operate according to the principle of chemical expansion, and which thus enables an improved resolution capacity, as well as to provide a method for structuring a photoresist layer in which the inventive photoresist compound or composition is used, and an improved resolution capacity is likewise achieved.

This object is achieved by the photoresist compound which include a film-forming polymer having molecular groups that can be converted into alkali-soluble groups through acid-catalyzed separation reactions, reactive molecular groups that can react with an expansion component so as to form a chemical bond, a photoacid generator that releases an acid when exposed with radiation from a suitable wavelength range, and a thermoacid generator that releases an acid when supplied with sufficient thermal energy. This object is also achieved by a method which comprises the steps of preparing a substrate having a photoresist layer made up of a photoresist compound comprising a film-forming polymer having molecular groups that can be converted into alkali-soluble groups through acid-catalyzed separation reactions, reactive molecular groups that can react with an expansion component so as to form a chemical bond, a photoacid generator that releases an acid when exposed with radiation from a suitable wavelength range, and a thermoacid generator that releases an acid when supplied with sufficient thermal energy is applied at least in subregions; irradiating the photoresist layer in subregions with light from the suitable wavelength range; heating the photoresist layer to a first temperature $T_1$, at which the separation reaction catalyzed by the photolytically produced acid takes place; developing the photoresist layer, heating the photoresist layer to a second temperature $T_2$, higher than the first temperature $T_1$, whereby the thermoacid generator releases the acid; and bringing the photoresist layer into contact with an expansion agent including an expansion component. Further advantageous specific embodiments, constructions, and aspects of the present invention will be apparent from the claims and the following description.

DESCRIPTION OF THE PREFERRED EMBODIMENTS

According to the invention, a photoresist compound or composition is provided that includes a film-forming polymer having molecular groups that can be converted into alkali-soluble groups through acid-catalyzed separation reactions, and having reactive molecular groups that can react with an expansion component so as to form a chemical bond. In addition, the photoresist compound or composition includes a photoacid generator that, upon being exposed with radiation from a suitable wavelength range, releases an acid, as well as a thermoacid generator that releases an acid when supplied with sufficient thermal energy.

In the context of this invention, the term "alkali-soluble groups" includes all groups that increase the solubility of the film-forming polymer in alkaline solutions. This term thus includes in particular polar functional groups, such as for example carboxyl, hydroxyl, and carboxamide groups, or groups comprising these functional groups. In addition, this term is to be understood as including groups that contribute not only to an increased alkali solubility of the polymer, but also groups that in addition further increase the transparency of the polymer—and thus of the photoresist layer—for light having very short wavelengths. This can be achieved by partial or complete fluorination of these groups. A suitable group is for example the 1,1,1,3,3,3,-hexafluoro-2-hydroxyisopropyl group, which increases the transparency of the polymer at a wavelength of 157 nm.

Molecular groups that can be converted into alkali-soluble groups through acid-catalyzed separation reactions are to be understood as including acid-labile groups having only a slight alkali solubility and that separate a molecule fragment through the action of acids, with simultaneous temperature treatment if necessary, the alkali-soluble groups being released on or in the polymer. Thus, this concept includes acid-labile protective groups such as are used regularly in positive resists. Here, all standard acid-labile protective groups can be used, such as for example ester groups, ether groups, cyclic or acyclic acetal groups, cyclic or acyclic ketal groups, silylethers, or cyanhydrines. Examples of suitable protective groups are indicated for example in U.S. Pat. Nos. 5,932,391 and 6,114,086, whose disclosures are incorporated by reference thereto. The phrase "separation reaction catalyzed by the photolytically produced acid" is also to be understood in this sense; i.e., that the separation reaction takes place under the action of the photolytically released acid. Particularly preferred acid-labile molecular groups in the present invention are ether groups selected from the group including tert.-alkylether, in particular tert.-butyl ether, tetrahydrofuranylether, and/or tetrahydropyranylether. Also preferred is the use of carboxyl acid esters selected from the group including tert.-alkylester, in particular tert.-butyl ester, tetrahydrofuranylester, tetrahydropyranylester, alkylcyclohexylester, and/or adamantylester. Acid-labile molecular groups that are likewise preferred are cyclic or acyclic ketals, cyclic or acyclic acetals, or butoxycarbonyloxy groups.

Particularly preferred are acid-labile molecular groups having the general structure according to formula II:

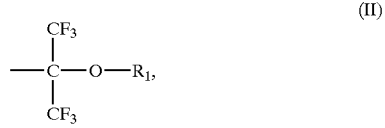

$R_1$ being selected from the group made up of tert.-alkyl-groups, in particular tert.-butyl-groups, tetrahydrofuranyl groups, tetrahydropyranyl groups, tert.-butoxycarbonyloxy groups, or acetal groups. These acid-labile molecular groups offer the advantage that the alkali-soluble groups remaining on the polymer can be at least partially fluorinated, which reduces the absorption of the film-forming polymer in the shortwave range.

Likewise preferred acid-labile molecular groups are groups of the general structure according to formula III, IV or V:

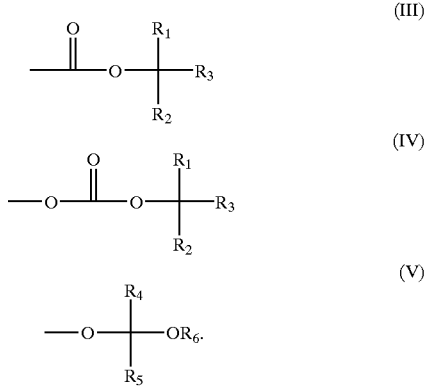

$R_1$, $R_2$, and $R_3$ being selected, independently of one another, from the group including methyl, ethyl, propyl, and butyl; preferably, $R_1$, $R_2$, and $R_3$ are methyl, and $R_4$, $R_5$, and $R_6$ are selected independently of one another from the group including hydrogen, methyl, ethyl, propyl, and butyl, with the condition that only $R_4$ or $R_5$ can be hydrogen, and $R_6$ is not hydrogen.

In the context of the present invention, reactive molecular groups are to be understood as groups that can react with expansion components such as are regularly used in chemical expansion reactions, so as to form a chemical bond. The chemical bond between the expansion components and the reactive molecular group can here be both covalent and also ionic in nature. The type of bond formed depends on the respective combination of reactive molecular groups and expansion components. Expansion components are to be understood as compounds specified later, in the context of the inventive method.

In a preferred specific embodiment of the present invention, the reactive molecular groups that can react with an expansion component are selected from the group including anhydride groups, succinic anhydride groups, epoxy groups, polyurethane groups, polymethacrylate groups, polyester groups, polyether groups, amide groups, phenol groups and thioester groups. Here, particularly preferred molecular groups are anhydride groups and succinic anhydride groups. These react particularly well to the corresponding acid amides, and are thus particularly well-suited for conversion with expansion reagents comprising reactive amino groups.

For the present invention, the nature of the main chain of the film-forming polymer is of lesser importance. Possibilities include all polymer types used regularly in photoresists. For example, polymers having pure carbon main chains, which can be obtained for example through polymerization of unsaturated monomers such as styroles, acrylates, or methacrylates, are suitable. Also suitable are polymers having heteroatoms in the main chains, such as for example polysiloxanes, polyether, or polyester. In the selection of the polymer to be used, its transparency in the radiated wavelength range is to be taken into account. Here the main chain can be constructed partly or entirely from fluorinated components, in order to improve transparency at low wavelengths.

In a preferred specific embodiment of the inventive photoresist compound, the film-forming polymer has an adapted absorption in the wavelength range between 150 and 450 nm. This increases the effectiveness of a photoacid generator that can be photochemically activated in this wavelength range.

In the context of the present invention, in principle all compounds can be used as photoacid generators that can release an acid when irradiated. In a particularly preferred variant of the invention, the photoacid generator releases an acid through exposure with radiation from the wavelength range between 150 and 450 nm. This enables the production of particularly fine structures in a photoresist that comprises the inventive photoresist compound.

In a further, particularly advantageous, specific embodiment of the present invention, the photoacid generator is selected from the group including onium compounds, in particular diphenyliodonium tritan trisulfoniumnonasulfate, nitrobenzylesters, in particular 4-nitrobenzyl-9,10-dimethoxyanthracene-2-sulfonate, sulfones, in particular phenylacylphenylsulfone, phosphates, in particular triarylphosphates, N-hydroxyimide sulfonates, in particular N-hydroxyphthalimide methanesulfonate, and/or diazonaphthochinones, in particular 1-oxo-2-diazonaphthochinone-5-arylsulfonate.

In the context of the present invention, the term "thermoacid generator" is to be understood as referring to compounds that release an acid when supplied with sufficient thermal energy. Such compounds are known to those skilled in the art. The thermoacid generator used should be selected such that its decomposition temperature, i.e., the temperature beginning from which the acid is released therefrom, is above the temperature at which, in a photolithographic method, the acid released photolytically from the photoacid generator reacts with the acid-labile molecular groups of the film-forming polymer.

In a particularly preferred specific embodiment of the present invention, the thermoacid generator can be split thermolytically at temperatures from 60 to 200° C. Here, thermoacid generators are particularly preferred that are selected from the group of thiolanium salts, in particular benzylthiolaniumhexafluoropropanesulfate, or from the nitrobenzylesters, in particular 2-nitrobenzyl tosylate.

Through the thermoacid generator in the inventive photoresist compound, it is possible in a photolithographic method to modify the polarity of a developed photoresist mask subsequently, for example, after the structural exposure, the heating step for the release of the alkali-soluble groups, and the developing. This is of particular importance for photolithographic methods in which the developed photoresist mask is to be chemically expanded. Without being limited thereto, this effect is based on what is described below. Through the thermoacid generator, in a heating step taking place before the chemical expansion reaction, acid can again be released in the photoresist layer that can then likewise react with the acid-labile protective groups of the film-forming polymer. In this way, the polarity of the polymer is further increased. Because the acid released in this way is distributed uniformly within the photoresist, this increase in polarity takes place uniformly in all regions of the photoresist. In this way, in all regions of the developed photoresist a polarity can be achieved at which the equilibrium between the development and the expansion existing in the chemical expansion reaction becomes insensitive to fluctuations in polarity of the order of magnitude observed in the photoresist as a result of the radiation absorption in the structural exposure. Thus, a uniform layer growth rate can be achieved within all regions of the developed photoresist mask. The influence of the polarity gradient within the profile edge regions is suppressed, so that an essentially uniform layer growth rate is observed inside these regions as well. In this way, the quality of the mask obtained after the chemical expansion reaction is improved, and the size of the smallest resolvable structure (CD) in the photolithographic structuring method is further reduced.

In addition, the inventive photoresist compound can include a solvent or a solvent mixture. This solvent enables the application of the photoresist compound on a substrate using a liquid-supported method. Such a method is for example the spinning on of a photoresist layer. All standard photoresist solvents or mixtures thereof can be used as solvents that are able to absorb the photoresist components in a clear, particle-free, and storage-stable solution, and to ensure a good layer quality in the coating of the substrate. In a particularly preferred specific embodiment of the present invention, the photoresist compound includes a solvent selected from the group made up of 1-methoxy-2-propylacetate, cyclopentanone, cyclohexanone, γ-butyrolactone, ethyl lactate, or mixtures of at least two of these solvents. Preferred are, in particular, photoresist compounds having 1 to 50 weight percent, preferably 3 to 20 weight percent, film-forming polymer, 0.01 to 10 weight percent, preferably 0.1 to 10 weight percent, photoacid generator, 0.01 to 10 weight percent, preferably 0.1 to 1 weight percent, thermoacid generator, and 50 to 99 weight percent, preferably 88 to 96 weight percent, solvent.

As additional components, the photoresist layer can contain additives with which an improvement of storage stability, useful life characteristic, film formation, resolution, sensitivity to radiation, or other product-improving or process-improving properties can be achieved regularly in photoresist layers or solutions thereof. The above-cited indications concerning the composition of the photoresist layer relate to a sum of 100 weight percent, taking into account all components contained in the photoresist.

In addition, the present invention includes a method for structuring a photoresist layer having the following steps: a substrate is prepared on which a photoresist layer made up of an inventive photoresist compound is applied at least in subregions. The photoresist layer is irradiated in subregions with light from the suitable wavelength range. The photoresist layer is heated to a first temperature $T_1$, at which the separation reaction catalyzed by the photolytically produced acid takes place. The photoresist layer is developed. The photoresist layer is heated to a second temperature $T_2$, higher than the first temperature $T_1$, whereby the thermoacid generator releases the acid. The photoresist layer is brought into contact with an expansion agent containing an expansion component.

In the inventive method, the photoresist layer can be applied directly on a layer that is to be structured and on the substrate, or can form a part of a two-layer or multilayer photoresist. Here, the photoresist layer can be applied onto the substrate using any suitable method for applying photoresist layers. For example, the photoresist layer can be spun on.

The structural exposure of the photoresist layer takes place, as a rule, using a lithography mask. Here, the exposure preferably takes place with radiation from the wavelength range between 150 and 450 nm.

In a particularly preferred specific embodiment of the inventive method, first temperature $T_1$ and second temperature $T_2$ are selected from the temperature range of 80 to 250° C. It is important that first temperature $T_1$ in the heating step be selected such that at this temperature the acid-catalyzed separation of the protective groups from the alkali-soluble groups begins or is completed, but the thermoacid generator remains undecomposed. With the separation of the acid-labile protective groups, the photoresist layer becomes soluble in relation to the developer in the exposed regions.

As a developer, here any suitable developer solution can be used that can selectively dissolve the exposed regions of the photoresist. In a particularly preferred specific embodiment of the present method, a solution of 2.38 weight percent tetramethyl ammonium hydroxide in water is used as a developer.

After the developing, in a further heating step the photoresist layer is heated to the second temperature $T_2$. In this way, on the one hand the photoresist layer is dried, and on the other hand the thermoacid generator is decomposed, whereupon it releases the acid. This acid likewise reacts with acid-labile protective groups of the film-forming polymer, resulting in an essentially uniform increase in polarity in the overall region of the developed photoresist layer.

Subsequently, the polarity-modified photoresist layer is subjected to the chemical expansion reaction. In a preferred variant of the inventive method, the expansion agent is brought into contact with the photoresist layer via the gas phase. Examples of such expansion reactions include the "dry silylation reactions" known to those skilled in the art.

In a further specific embodiment of the inventive method, the photoresist layer is brought into contact with a liquid containing the expansion agent. Here, the liquid can be the expansion agent or the expansion component itself, or a solution or emulsion of the expansion agent or of the expansion component in a suitable solvent, for example water or aqueous alcohol. In this guiding of the reaction, the bringing into contact can take place in a spray developer, puddle developer, or immersion developer. Examples of such reactions are known to those skilled in the art as what are called "wet silylation reactions."

As expansion components, all compounds can be used that can react with the reactive molecular groups of the film-forming polymer so as to form a chemical bond, leading in this way to a layer thickness growth of the photoresist layer. In a preferred specific embodiment of the inventive method, the expansion component has aliphatic primary or secondary amino groups. Particularly preferred are diamines containing aromatic compounds, in particular 1,3-diaminomethylbenzene and 1,3-diaminobenzene, or chain-type dimethylsiloxanes having terminal aminopropyl units and 1 to 50, preferably 1 to 20, silicon atoms per molecule. These expansion components are preferably liquid-borne, i.e., are brought into contact with the photoresist layer in the context of a "wet silylation reaction." If 1,3-diaminomethylbenzene is used, it is preferably used in the form of a 1% solution in hexanol or hexyl alcohol.

In a further advantageous variant of the inventive method, the expansion component is selected from the group made up of hexamethyldisilazane, hexamethylcyclotrisilazane, trimethylsilylethylisocyanate, and/or dimethylsilyldimethylamine. These expansion components are preferably brought into contact with the photoresist layer via the gas phase in the context of a "dry silylation reaction." Here, the gas can consist of the expansion components alone, or can include further components, such as for example chemically inert bearer gases, in particular $N_2$ or noble gases, preferably helium or argon.

The precise method conditions can be selected and adapted to one another dependent on the respectively selected composition of the inventive photoresist compound, and thus also on the respective properties of the components contained therein.

In the following, the use of the inventive photoresist compound is illustrated on the basis of an exemplary embodiment of the inventive method.

On a bottom resist layer that was applied on a substrate to be structured, a top resist layer made up of the inventive photoresist layer is spun on. In a following heating step, in which the solvent can vaporize, the top resist layer is dried at a temperature between 60 and 160° C. This temperature is selected so that during this first drying the thermoacid generator is not decomposed. The dried top resist layer is subsequently exposed, using a photomask, with radiation having the wavelength 248 nm (deep ultraviolet). Through the irradiation, the photoacid generator is photochemically activated in the exposed regions, producing a latent image of the desired structure in the top resist layer. Due to the absorption-caused attenuation of the light intensity, the disadvantageous acid distribution arises within the top resist layer. In the following heating step, which is called the post-exposure bake (PEB), and which heating step has a temperature greater than that of the first drying step and in the range between 80 and 250° C, in the exposed regions of the top resist layer the functional protective groups of the film-forming polymer are separated by the acid released by the photoacid generator. In this way, the polarity and hydrophilia of the film-forming polymer are increased in these regions, and the resist thus becomes soluble in relation to the alkaline developer. Temperature $T_1$ is here chosen such that a thermal decomposition of the thermoacid generator does not take place in the top resist layer. Subsequently, the top resist layer is developed using a 2.38 weight percent aqueous solution of tetramethyl ammonium hydroxide, during which the exposed regions of the top resist layer are detached and removed, while the unexposed regions remain in place. In this way, a positive relief pattern is produced in the top resist layer. Subsequently, the top resist layer is subjected to an additional heating step at a temperature $T_2$: temperature $T_2$ is likewise located in the range between 80 and 250° C, but is selected higher than temperature $T_1$. In this heating step, the thermoacid generator is thermally decomposed, and at the same time the developed top resist layer is dried. The acid released through the decomposition of the thermoacid generator separates additional acid-labile protective groups from the film-forming polymer, through which the polarity of the polymer is further increased inside the developed top resist layer.

Subsequently, the structured top resist layer is exposed to an expansion agent, for example, a 1% solution of 1,3-diaminobenzene, and is chemically expanded in this way. The layer thickness growth on the mask can here be controlled for example via the duration of the expansion reaction.

While the preferred embodiments have been described in detail in the foregoing description, the same is to be considered as illustrative and not restrictive in character, it being understood that only the preferred embodiments have been described and that all changes and modifications that come within the spirit of the invention both now or in the future are desired to be protected.

We claim:

1. A photoresist composition comprising:
   a) a film-forming polymer having
      aa) molecular groups that can be converted into alkali-soluble groups through acid-catalyzed separation reactions,
      ab) reactive molecular groups that can react with an expansion component so as to form a chemical bond,
   b) a photoacid generator that releases an acid when exposed with radiation from a suitable wavelength range, and
   c) a thermoacid generator that releases an acid when supplied with sufficient thermal energy.

2. A photoresist compound according to claim 1, wherein the molecular groups in the polymer that can undergo the acid-catalyzed separation reactions are selected from the group consisting of
   a) carboxyl acid esters which are selected from the group consisting of tert.-alkylester, tetrahydrofuranylester, tetrahydropyranylester, alkylcyclohexylester, and adamantylester;
   b) ether groups which are selected from the group consisting of tert.-alkylether, tert.-butyl ether, tetrahydrofuranylether, and tetrahydropyranylether;
   c) a compound which is selected from the group consisting of cyclic ketals, acyclic ketals, acyclic acetals, and cyclic acetals; and d) butoxycarbonyloxy groups.

3. A photoresist composition according to claim 1, wherein the molecular group in the polymer that can undergo the acid-catalyzed separation reactions are the group having the structure according to formula II:

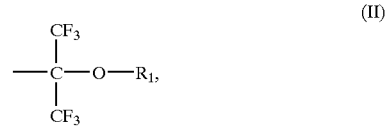

(II)

$R_1$ being selected from the group consisting of tert.-alkyl-groups, tert.-butyl-groups, tetrahydrofuranyl group, tetrahydropyranyl groups, tert.-butoxycarbonyloxy groups, and acetal groups, and groups having the structure according to one of the formulas III, IV, or V,

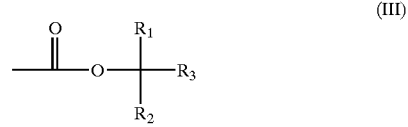

(III)

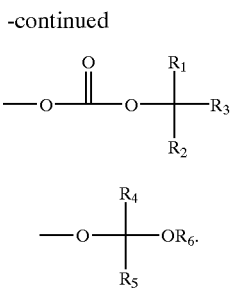

with $R_1$, $R_2$, and $R_3$ being selected independently of one another from the group consisting of methyl, ethyl, propyl, and butyl, and $R_4$, $R_5$, and $R_6$ being selected independently of one another from the group consisting of hydrogen, methyl, ethyl, propyl, and butyl, with the condition that only $R_4$ or $R_5$ can be hydrogen, and $R_6$ is not hydrogen.

4. A photoresist composition according to claim 3, wherein, for a selected one of the formulae III and IV, $R_1$, $R_2$ and $R_3$ are methyl and for the selected formula V, $R_4$ and $R_5$ are methyl.

5. A photoresist composition according to claim 1, wherein the thermoacid generator can be thermolytically split at temperatures between 60 and 200° C.

6. A photoresist composition according to claim 1, wherein the thermoacid generator is a compound selected from the group consisting of thiolanium salts, benzylthiolaniumhexafluoropropanesulfate, nitrobenzylesters, and 2-nitrobenzyl tosylate.

7. A photoresist composition according to claim 1, wherein the photoacid generator releases an acid through exposure with radiation from the wavelength range between 150 and 450 nm.

8. A photoresist composition according to claim 1, wherein the photoacid generator is selected from the group consisting of onium compounds, diphenyliodonium triflate, trisulfoniumnonasulfate, nitrobenzylesters, 4-nitrobenzyl-9, 10-dimethoxyanthracene-2-sulfonate, sulfones, phenylacylphenylsulfone, phosphates, triarylphosphates, N-hydroxyimide sulfonates, N-hydroxyphthalimide methane sulfonate, diazonaphthochinones, and 1-oxo-2-diazonaphthochinone-5-arylsulfonate.

9. A photoresist composition according to claim 1, wherein the reactive molecular groups that can react with an expansion component are selected from the group consisting of anhydride groups, succinic anhydride groups, epoxy groups, polyurethane groups, polymethacrylate groups, polyester groups, polyether groups, amide groups, phenol groups and thioester groups.

10. A photoresist compound composition according to claim 1, wherein the film-forming polymer has an adapted absorption in the wavelength range between 150 and 450 nm, so that the photoacid generator can be photochemically activated.

11. A photoresist composition according to claim 1, wherein the photoresist compound includes a solvent selected from the group consisting of 1-methoxy-2-propylacetate, cyclopentanone, cyclohexanone, γ-butyrolactone, ethyll actate, and mixtures of at least two of these solvents.

12. A photoresist composition according to claim 11, wherein the photoresist compound includes 1 to 50 weight percent, of the film-forming polymer, 0.01 to 10 weight percent, of the photoacid generator, 0.01 to 10 weight percent, of the thermoacid generator, and 50 to 99 weight percent, of the solvent.

13. A photoresist composition according to claim 12, wherein the film forming polymer in 3 to 20 weight percent, the photoacid generator in 0.1 to 10 weight percent, the thermoacid generator is 0.1 to 1 weight percent and the solvent is 88 to 96 weight percent.

14. A method for structuring a photoresist layer, comprising the steps of:
  a) preparing a substrate which has a photoresist layer made up of a photoresist composition applied at least in subregions, said photoresistant composition comprising a film-forming polymer having molecular groups that can be converted into alkali-soluble groups through acid-catalyzed separation reactions, reactive molecular groups that can react with an expansion component so as to form a chemical bond, a photoacid generator that releases an acid when exposed with radiation from a suitable wavelength range, and a thermoacid generator that releases an acid when supplied with sufficient thermal energy;
  b) irradiating the photoresist layer in the subregions with light from the suitable wavelength range;
  c) heating the photoresist layer to a first temperature $T_1$, at which the separation reaction catalyzed by the photolytically produced acid takes place;
  d) developing the photoresist layer;
  e) heating the photoresist layer to a second temperature $T_2$, higher than the first temperature $T_1$, whereby the thermoacid generator releases the acid; and
  f) bringing the photoresist layer into contact with an expansion agent including an expansion component.

15. A method according to claim 14, wherein the first temperature $T_1$ and the second temperature $T_2$ are each selected from the temperature range from 80 to 250° C.

16. A method according to claim 14, wherein the steps of developing uses, a solution of 2.38 weight percent tetramethyl ammonium hydroxide in water.

17. A method according to claim 14, wherein the expansion agent is brought into contact with the photoresist layer via the gas phase.

18. A method according to claim 14, wherein the photoresist layer is brought into contact with a liquid comprising the expansion agent.

19. A method according to claim 14, wherein the expansion component is selected from aliphatic primary amino groups and aliphatic secondary amino groups.

20. A method according to claim 14, wherein the expansion component is selected from the group consisting of diamines containing aromatic compounds, 1,3-diaminomethylbenzene, 1,3-diaminobenzene, chain-type dimethylsiloxanes having terminal aminopropyl units and 1 to 50 silicon atoms per molecule.

21. A method according to claim 14, wherein the expansion component is selected from the group consisting of hexamethyldisilazane, hexamethylcyclotrisilazane, trimethylsilylethylisocyanate, and dimethylsilyldimethylamine.

* * * * *